United States Patent
Du

(10) Patent No.: US 10,451,945 B2
(45) Date of Patent: Oct. 22, 2019

(54) DISPLAY PANEL AND THIN FILM TRANSISTOR ARRAY SUBSTRATE

(71) Applicant: SHENZHEN CHINA STAR OPTOELECTRONICS TECHNOLOGY CO., LTD., Shenzhen (CN)

(72) Inventor: Peng Du, Shenzhen (CN)

(73) Assignee: SHENZHEN CHINA STAR OPTOELECTRONICS TECHNOLOGY CO. LTD., Shenzhen (CN)

( * ) Notice: Subject to any disclaimer, the term of this patent is extended or adjusted under 35 U.S.C. 154(b) by 0 days.

(21) Appl. No.: 14/906,622

(22) PCT Filed: Jan. 11, 2016

(86) PCT No.: PCT/CN2016/070602
§ 371 (c)(1),
(2) Date: Jan. 21, 2016

(87) PCT Pub. No.: WO2017/107256
PCT Pub. Date: Jun. 29, 2017

(65) Prior Publication Data
US 2018/0292692 A1 Oct. 11, 2018

(30) Foreign Application Priority Data
Dec. 24, 2015 (CN) .......................... 2015 1 0989784

(51) Int. Cl.
*H01L 27/12* (2006.01)
*G02F 1/1368* (2006.01)
(Continued)

(52) U.S. Cl.
CPC .......... *G02F 1/1368* (2013.01); *G02F 1/1345* (2013.01); *G02F 1/13394* (2013.01);
(Continued)

(58) Field of Classification Search
CPC . H01L 21/775; H01L 27/12; H01L 29/76818; H01L 29/66765;
(Continued)

(56) References Cited

U.S. PATENT DOCUMENTS 7,190,360 B1 * 3/2007 Hiroki .................. G09G 3/3633
345/103
8,035,779 B2 * 10/2011 Baek .................. G02F 1/136209
349/110
(Continued)

FOREIGN PATENT DOCUMENTS

CN 101676783 A 3/2010

*Primary Examiner* — Thinh T Nguyen
(74) *Attorney, Agent, or Firm* — Mark M. Friedman

(57) ABSTRACT

A display panel includes a first substrate and a second substrate. A thin film transistor is disposed on the first substrate. The display panel has a non-display area; the non-display area includes a first metal layer, a frequency signal line formed by a second metal layer and located on the first metal layer, a via (contact hole), and a conducting electrode electrically connecting the first and a second metal layers together. At least a part of the conducting electrode is located in the via. A photo spacer is located in the via, for separating the first substrate and the second substrate. The photo spacer completely covers the conducting electrode. The photo spacer is made of a dielectric material.

1 Claim, 2 Drawing Sheets

(51) Int. Cl.
*G02F 1/1362* (2006.01)
*G02F 1/1339* (2006.01)
*G02F 1/1345* (2006.01)
*G02F 1/1333* (2006.01)

(52) U.S. Cl.
CPC .. *G02F 1/136209* (2013.01); *G02F 1/136286* (2013.01); *H01L 27/1244* (2013.01); *G02F 1/13454* (2013.01); *G02F 2001/133388* (2013.01)

(58) Field of Classification Search
CPC ............. H01L 29/78621; G02F 1/1368; G02F 1/136209; G02F 1/136286; G02F 1/13454
USPC ................................ 257/72, 59; 438/48, 128
See application file for complete search history.

(56) References Cited

U.S. PATENT DOCUMENTS

| | | | |
|---|---|---|---|
| 2001/0013919 A1 | 8/2001 | Sato | |
| 2010/0033646 A1* | 2/2010 | Baek et al. | H01L 33/00 257/59 |
| 2011/0063262 A1* | 3/2011 | Umezaki | G09G 3/20 345/204 |
| 2011/0227867 A1* | 9/2011 | Ogawa et al. | G06F 3/041 345/174 |
| 2013/0032827 A1* | 2/2013 | Moon et al. | H01L 27/124 257/88 |
| 2015/0146138 A1* | 5/2015 | Jung et al. | H01L 27/1292 438/27 |
| 2015/0338692 A1* | 11/2015 | Yu-Jin | G02F 1/1368 349/33 |
| 2017/0102578 A1* | 4/2017 | Shin et al. | H01L 27/1222 |
| 2017/0160583 A1* | 6/2017 | Baek et al. | G02F 1/1368 |

* cited by examiner

DISPLAY PANEL AND THIN FILM TRANSISTOR ARRAY SUBSTRATE

FIELD OF THE INVENTION

The present invention relates to a display panel and a thin film transistor array substrate, and in particular to a display panel and a thin film transistor array substrate used for a thin film transistor-liquid crystal display (TFT-LCD).

BACKGROUND OF THE INVENTION

Narrow border has become more popular in panel design nowadays; the narrow border products also have stronger competitiveness in the market.

In a TFT-LCD panel of a vertical alignment (VA) type, a color filter (CF) is important for the formation of the liquid crystal capacitor, and the control of the deflection of the liquid crystal molecules. Because the IC for controlling the color filter is mounted to a TFT substrate, a transfer pad which can transfer a signal of a common electrode of the CF from the TFT substrate to the CF substrate is a necessary structure for the display panel of a VA type. Usually, the common electrode signal of the CF is transferred to the CF substrate through Au balls at a transfer position; a size of the transfer pad is often larger than usual, occupying more peripheral wiring space, which is very bad for the existing narrow border design. In order to decrease the size of the transfer pad, an Au-in-seal method is often used, that is, the Au balls are distributed in the frame seal, which is evenly coated on the peripheral position of the panel. Thus the signal of the common electrode of the CF is transferred to the CF substrate through a smaller transfer pad. A drawback of this approach is that conductive materials contained at the seal are only allowed to electrically connect with the common electrode for the CF, and not allowed to contact any via (contact hole) of other signals; otherwise short circuits happen in different signals, and the panel can not work normally. The problem is more serious in gate driver on array circuits (GOA). This is because of the many frequency signal lines on the gate side of the GOA circuit. The frequency signal lines usually overlap with the seal frame, and the frequency signal lines have many vias through which the frequency signal lines connect with the GOA circuit. The Au-in-seal technology used in the narrow border panel results in the problem of a short circuit of the frequency signal in the GOA circuit.

FIG. 1 is a diagram of peripheral wiring on the gate side of the panel of a traditional GOA circuit. For a panel using a GOA structure, the amount of frequency signals used by the GOA circuit, such as CK1, CK2 in FIG. 1, is more, occupying more space on the gate side. The frequency signal needs the vias (contact holes) 10 to be transferred to the GOA circuit. If these vias 10 contact with the Au balls (not shown), then a short circuit thus happens between different signals, which makes the GOA circuit not able to work normally.

FIG. 2 illustrates a cross-sectional view of the frequency signal line in FIG. 1. As shown in FIG. 2, the GOA circuit 2 is often made of a first metal layer 20, conducted to a frequency line formed by a second metal layer 21 through the via 10. At the via 10, a dielectric layer on the metal line is dug through dry etching. An Indium Tin Oxide (ITO) electrode 22 is formed to connect the metal lines of different layers. A voltage level of the frequency signal is on the ITO electrode 22, if directly contacting with the Au ball (not shown) at a seal, the short circuit of the frequency signal and the signal of the common electrode of CF happens, which makes the GOA circuit not able to work normally.

SUMMARY OF THE INVENTION

In order to solve the problem of the short circuit between the frequency signals, the present invention optimizes the existing panel design, combines the developing technology of a photo spacer on array, redesigns the peripheral photo spacer, and solve the problem of the short circuit between the frequency signals when the Au-in-seal method is used in a GOA circuit.

According to an embodiment of the present invention, a display panel is provided, including a first substrate, a second substrate, and a thin film transistor disposed on the first substrate. The display panel has a non-display area; the non-display area includes a first metal layer; a via (contact hole), located on the first metal layer; a conducting electrode, at least a part of the conducting electrode located in the via; a photo spacer (PS), used for separating the first substrate and the second substrate, the photo spacer covering the conducting electrode; and a second metal layer, electrically connecting the first metal layer through the conducting electrode on the via.

Preferably, the photo spacer completely covers the conducting electrode.

Preferably, the photo spacer is made of a dielectric material.

Preferably, the conducting electrode is made of ITO (Indium Tin Oxide).

Preferably, the photo spacer is used for separating the first substrate and the second substrate having a color filter, and is located in the via.

Preferably, the second metal layer forms a frequency signal line.

Compared with traditional GOA circuit structure, the present invention realizes the Au-in-seal structure on the GOA panel, further decreases the size of the panel frame, and matches the market trends nowadays.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

Figure 1:
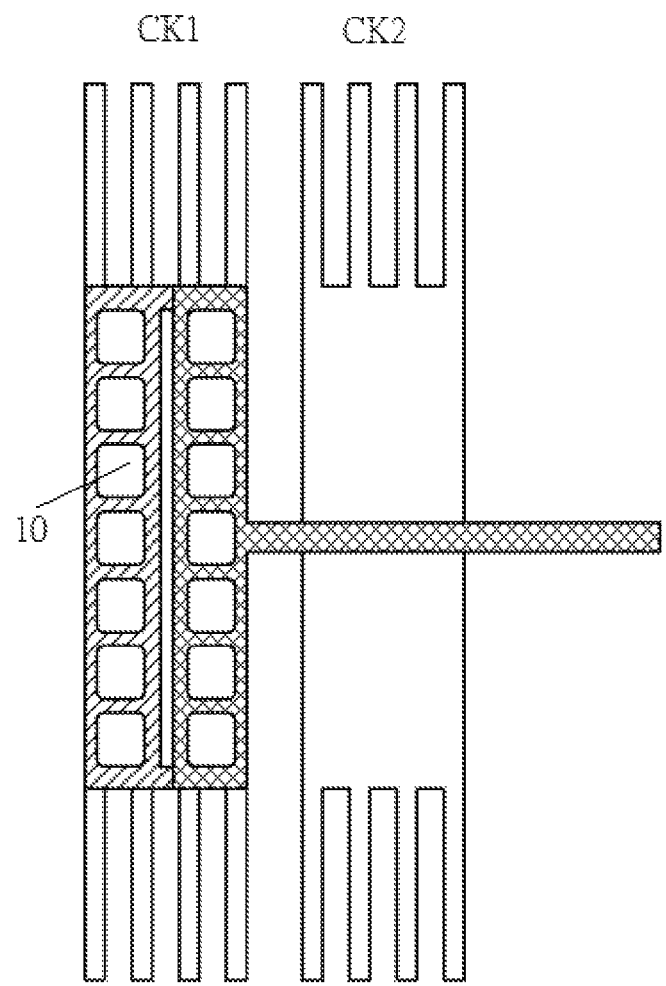
FIG. 1 is a diagram of peripheral wiring on the gate side of the panel of traditional GOA circuit.
Figure 2:
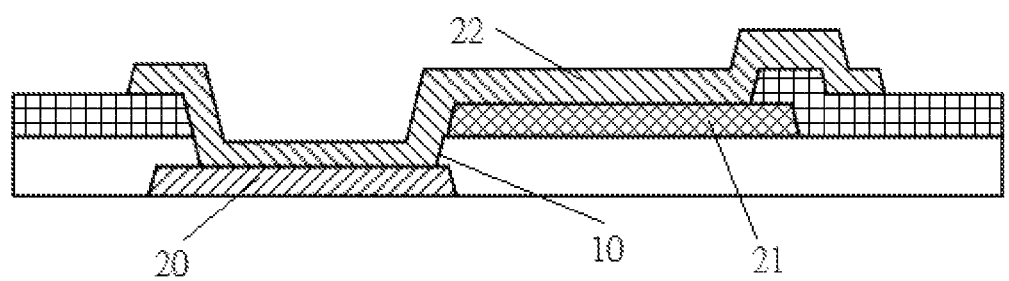
FIG. 2 illustrates a cross-sectional view of the frequency signal line in FIG. 1.

As used in this specification the term "embodiment" means an instance, example, or illustration. In addition, for the articles in this specification and the appended claims, "a" or "an" in general can be interpreted as "one or more" unless specified otherwise or clear from context to determine the singular form.

In the drawings, the same reference numerals denote units with similar structures.

Figure 3:
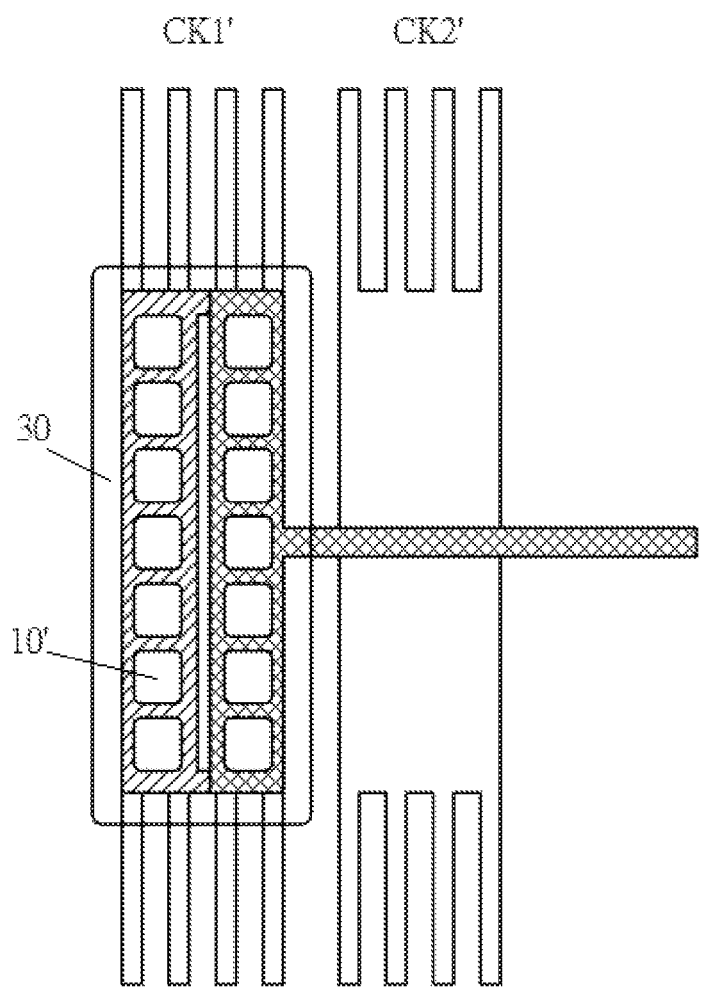
FIG. 3 is a diagram of a layout of the frequency line according to an embodiment of the present invention.

FIG. 3 is a diagram of a layout of the frequency line according to an embodiment of the present invention. As shown in FIG. 3, the present invention has frequency signal lines CK1', CK2' formed in a non-display area of a thin film transistor array substrate. The present invention uses a photo spacer 30. Conventionally, a photo spacer is usually formed on a color filter to properly separate the color filter and the thin film transistor array substrate. The present invention forms the photo spacer 30 on the thin film transistor array substrate, not only for properly separating the color filter and the thin film transistor array substrate, but also for completely covering the via 10' on the GOA circuit 4 (FIG. 4) connected with the frequency signal line CK1'. Especially the photo spacer 30 is used for completely covering an ITO electrode 22' (FIG. 4) at the via 10'. The photo spacer 30 is substantially made of a dielectric material, thus when the Au-in-seal process is used, the frequency signal line is prevented from contacting with the Au balls (not shown) in the seal, and a short circuit between different signals is prevented. In addition, the present invention is not only for the aforementioned GOA frequency signal line CK', but also for the via of similar structure.

Figure 4:
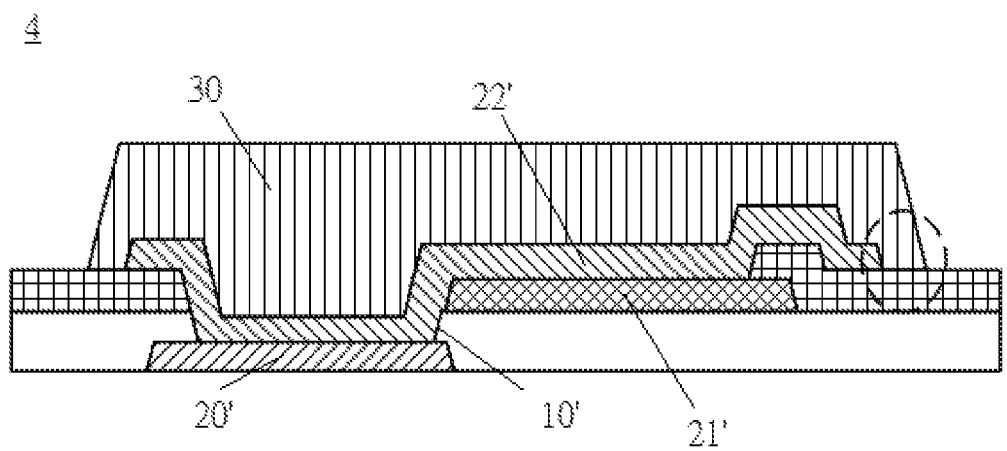
FIG. 4 illustrates a cross-sectional view of the frequency signal line in FIG. 3, through a via thereof.

FIG. 4 illustrates a cross-sectional view of the frequency signal line in FIG. 3, through the via 10' thereof. As shown in FIG. 4, the GOA circuit 4 is made of a first metal layer 20'. A frequency signal line formed by a second metal layer 21' and the GOA circuit 4 are electrically connected together through the via 10'. At the via 10', a dielectric layer on the metal line is dug through dry etching, the ITO electrode 22' is formed in the via 10', and extends to outside of the via 10', to connect metal lines of different layers (that is, the first and second metal layer 20', 21'). The photo spacer 30 not only completely covers the via 10', but also completely covers the farthest position of the ITO electrode 22' extending out of the via 10', especially the position marked with a dotted circle as shown in the diagram, to completely cover the ITO electrode 22'. A size of the photo spacer 30 is larger than a size of the ITO electrode 22' at the via 10', thus the ITO electrode 22' is completely covered. The photo spacer 30 is substantially dielectric, and having a larger thickness, whereby when the Au-in-seal process is used, the photo spacer 30 can separate the frequency signal line and the Au balls and the common electrode signal line of the CF, to prevent the short circuit from happening. In this way, the Au-in-seal process is used on the panel of the GOA structure, which is helpful for decreasing the size of the panel frame, and is very advantageous to the narrow frame design.

The present invention realizes the Au-in-seal structure on the GOA panel, further decreases the size of the panel frame, and matches the market trends nowadays.

In summary, although the preferable embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A display panel, comprising:
   a first substrate and a second substrate, a thin film transistor disposed on the first substrate; the display panel having a non-display area, the non-display area comprising:
   a first metal layer;
   a via, located on the first metal layer;
   a conducting electrode, made of indium tin oxide (ITO), wherein at least a part of the conducting electrode is located in the via;
   a photo spacer, configured for separating the first substrate and the second substrate having a color filter, wherein the photo spacer is directly disposed on the conduction electrode and located in the via, completely covers the conducting electrode, and is made of a dielectric material; and
   a second metal layer constituting a frequency signal line, and electrically connected with the first metal layer through the conducting electrode in the via;
   wherein the photo spacer separates the frequency signal line from Au balls and common electrode signal lines of the color filter.

* * * * *